(12) United States Patent  
Michael et al.

(10) Patent No.: US 8,866,364 B2  
(45) Date of Patent: Oct. 21, 2014

(54) PIEZO-ELECTRIC BASED MICRO-ELECTRO-MECHANICAL LENS ACTUATION SYSTEM

(76) Inventors: Aron Michael, Dollspoint (AU); Chee Yee Kwok, St Ives (AU)

( * ) Notice: Subject to any disclaimer, the term of this patent is extended or adjusted under 35 U.S.C. 154(b) by 67 days.

(21) Appl. No.: 13/808,341

(22) PCT Filed: Jul. 4, 2011

(86) PCT No.: PCT/AU2011/000837  
§ 371 (c)(1),  
(2), (4) Date: Jan. 4, 2013

(87) PCT Pub. No.: WO2012/003529  
PCT Pub. Date: Jan. 12, 2012

(65) Prior Publication Data  
US 2013/0114149 A1    May 9, 2013

(30) Foreign Application Priority Data

Jul. 5, 2010    (AU) ................. 2010902976

(51) Int. Cl.
| | |
|---|---|
| H01L 41/00 | (2013.01) |
| G02B 13/00 | (2006.01) |
| H01L 41/09 | (2006.01) |
| G02B 26/08 | (2006.01) |

(52) U.S. Cl.  
CPC ........ *G02B 13/0075* (2013.01); *H01L 41/0986* (2013.01); *H01L 41/0953* (2013.01); *G02B 26/0858* (2013.01); *H01L 41/0906* (2013.01)  
USPC .......................................... 310/311; 359/824

(58) Field of Classification Search  
USPC .......... 359/323, 696, 822, 824; 310/309, 311, 310/330–332, 367, 368, 365, 366, 323.06  
See application file for complete search history.

(56) References Cited

U.S. PATENT DOCUMENTS

| | | | |
|---|---|---|---|
| 6,713,944 B2 | 3/2004 | Omata et al. | |
| 7,782,526 B2* | 8/2010 | Sinquin et al. | 359/297 |
| 7,992,969 B2* | 8/2011 | Tanaka et al. | 347/68 |

FOREIGN PATENT DOCUMENTS

| | | |
|---|---|---|
| JP | 05-136476 A | 6/1993 |
| JP | 2008-040240 A | 2/2008 |
| WO | WO-02/24570 A1 | 3/2002 |
| WO | WO-03/089957 A2 | 10/2003 |

OTHER PUBLICATIONS

International Search Report for PCT/AU2011/000837, mailed Aug. 29, 2011; ISA/AU.

* cited by examiner

*Primary Examiner* — Tuyen Tra  
(74) *Attorney, Agent, or Firm* — Harness, Dickey & Pierce, PLC

(57) ABSTRACT

Disclosed is a piezo-electrically actuated micro-mechanical deformable member comprising a corrugated longitudinal beam (521) formed in a substrate, and having a first anchored end (502) and a second end (509), as well as a plurality of piezoelectric film (PZET) actuating segments (522, 523, 524) formed in or on at least some grooves and ridges of the corrugated beam, the beam (521) being configured to assume one of a number of different geometric configurations depending upon which of a corresponding set of electric actuation signals (105) are applied to the PZET elements, the electric actuation signals establishing corresponding electric fields in the associated PZET segments to thereby deform the member.

19 Claims, 12 Drawing Sheets

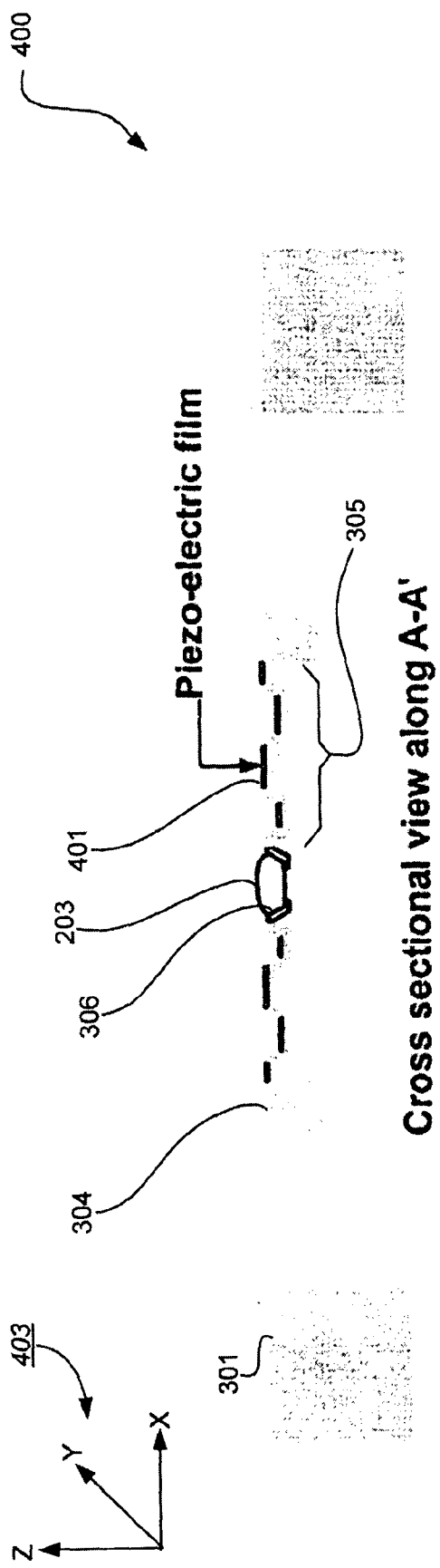
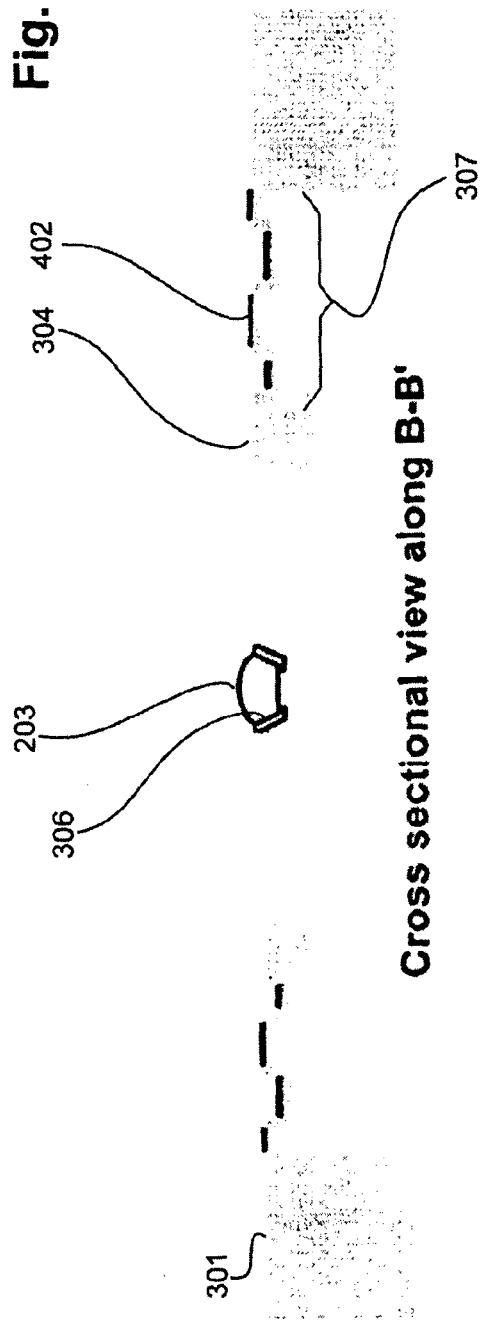
Fig. 4A — Cross sectional view along A-A'
Fig. 4B — Cross sectional view along B-B'

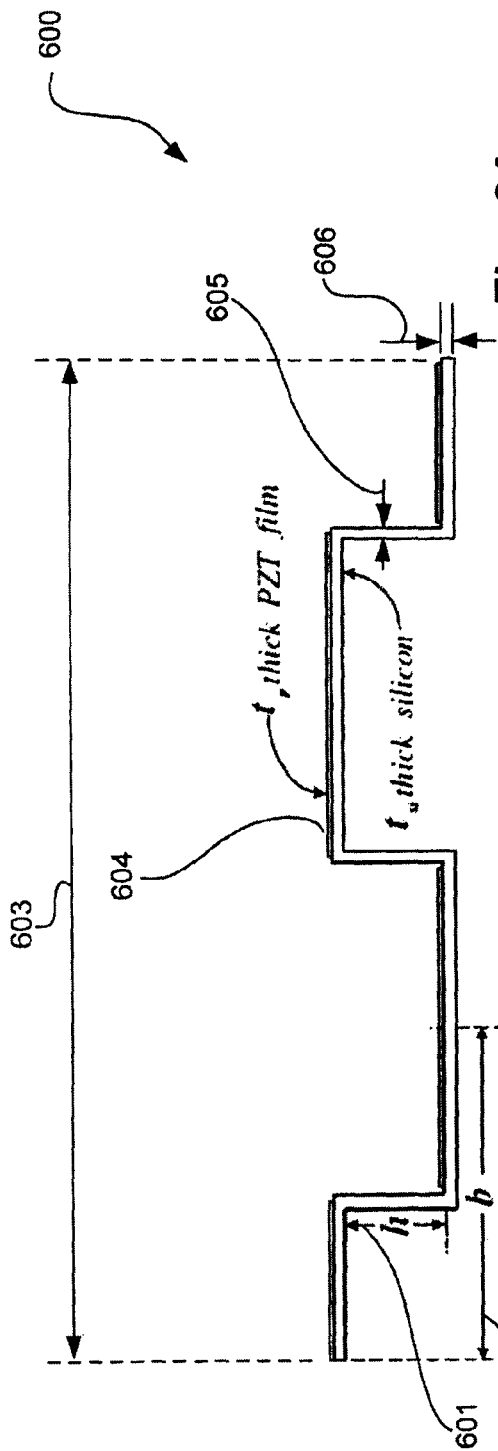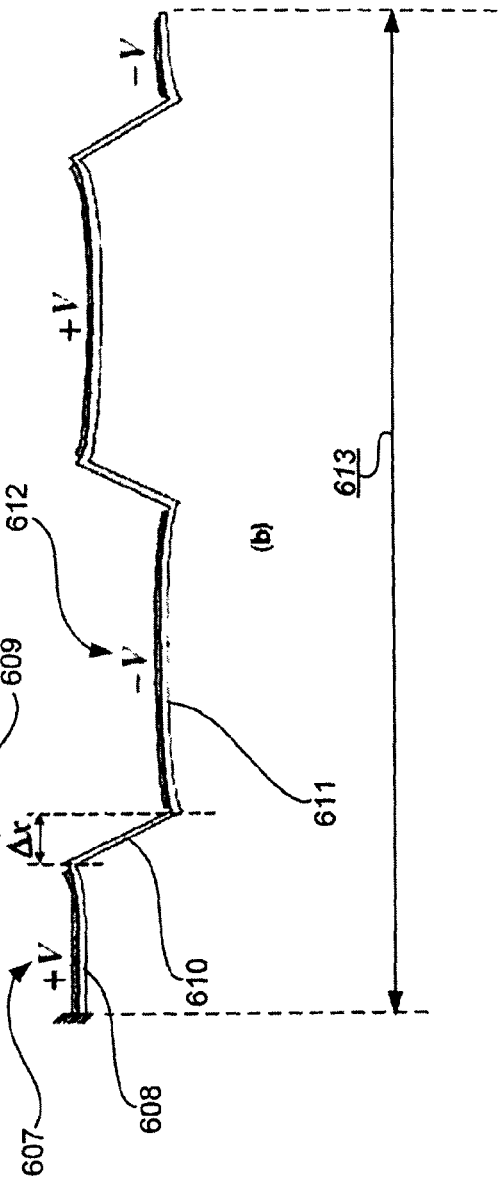
Fig. 6A
Fig. 6B

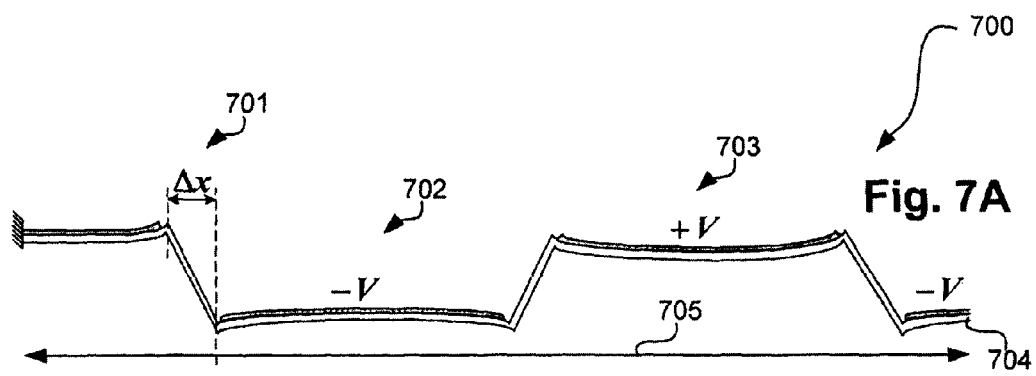
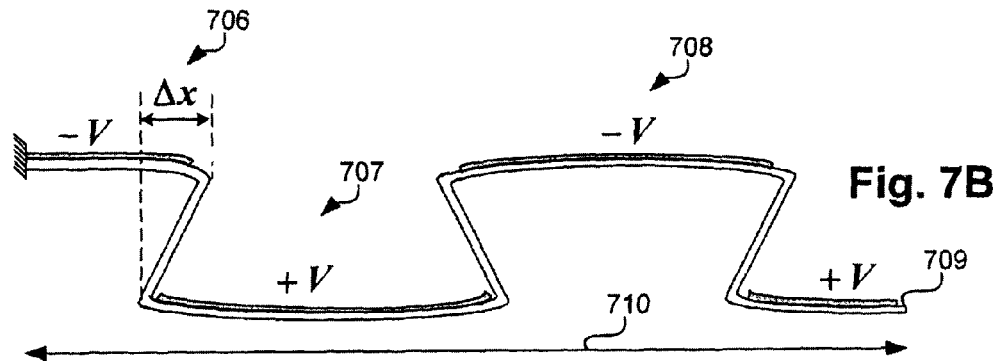
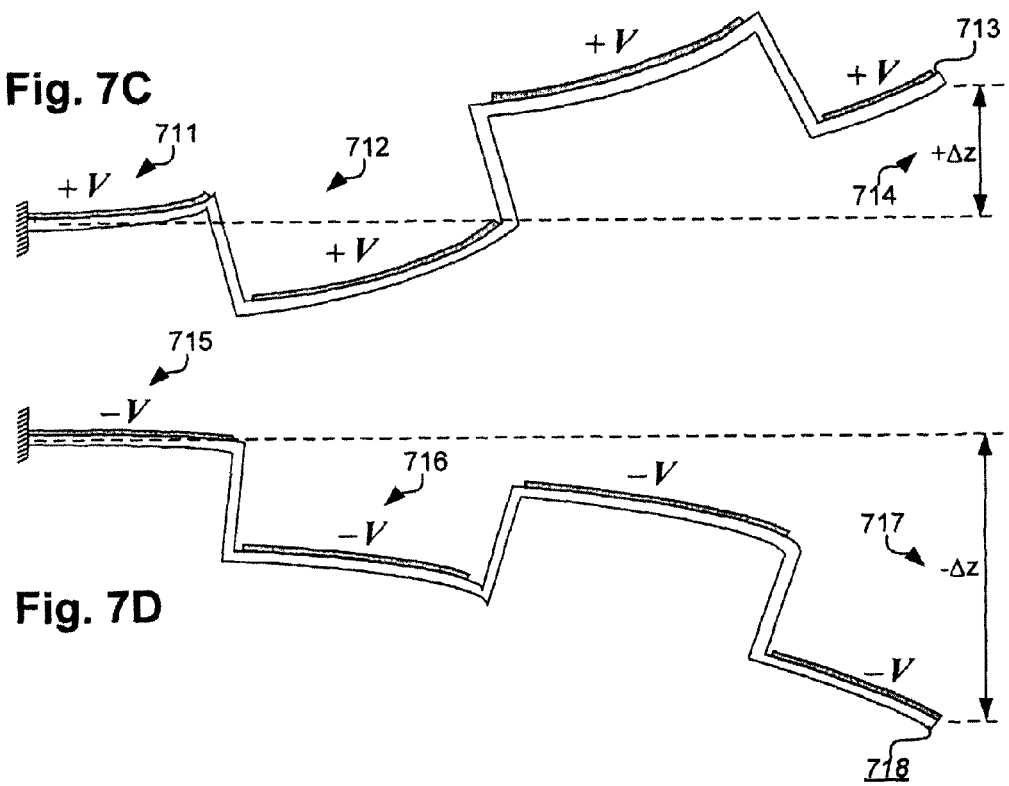

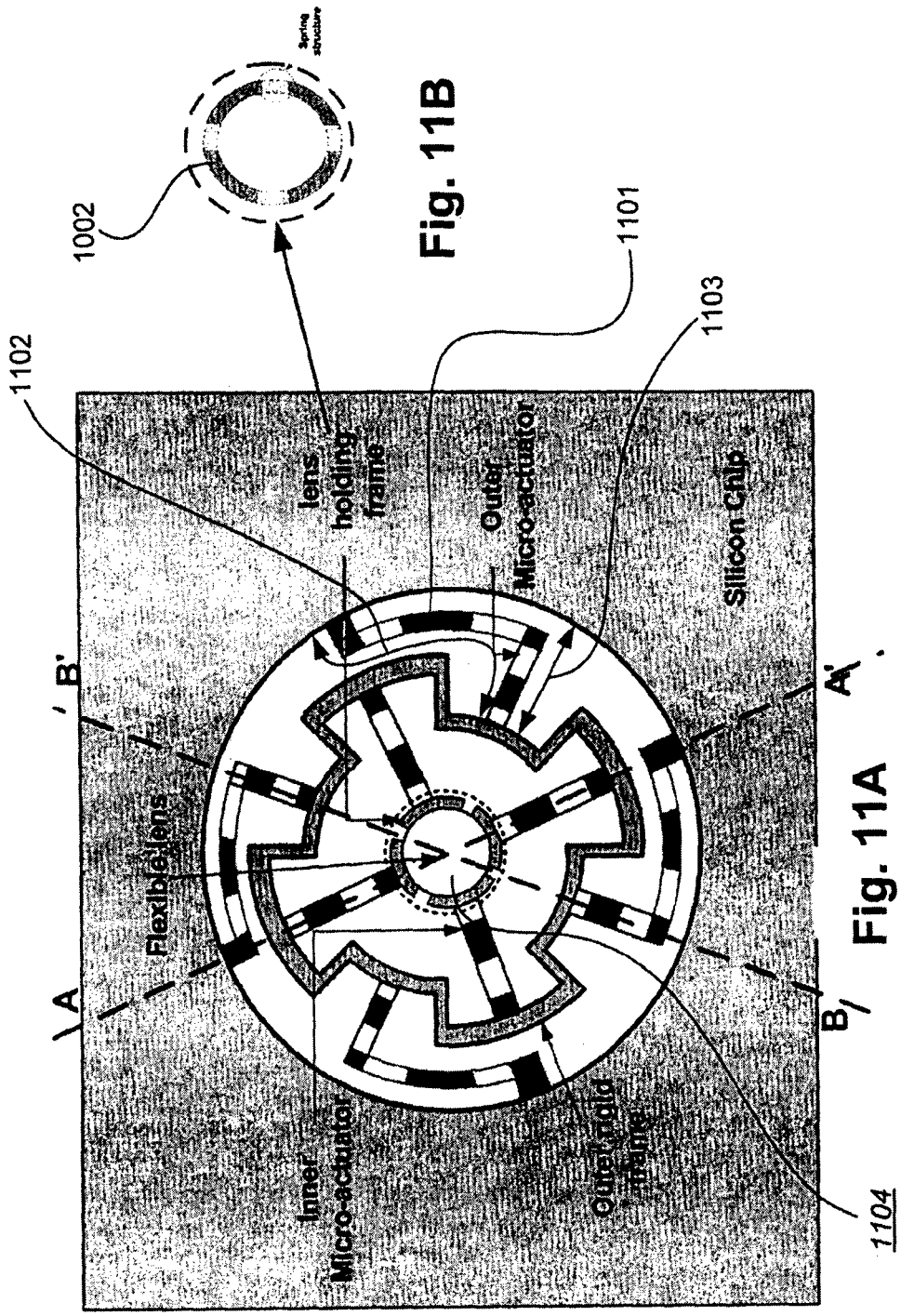

PIEZO-ELECTRIC BASED MICRO-ELECTRO-MECHANICAL LENS ACTUATION SYSTEM

REFERENCE TO RELATED PATENT APPLICATION(S)

This application is a 371 U.S. National Stage of International Application No. PCT/AU2011/000837, filed on 4 Jul. 2011, which claims the benefit of the earlier filing date of Australian Patent Application No. 2010902976 entitled "Piezo-electric based micro-mechanical lens actuation system", filed on 5 Jul. 2010 in the name of NewSouth Innovations Pty Limited, both of which applications are hereby incorporated by reference in their entirety as if fully set forth herein.

TECHNICAL FIELD OF THE INVENTION

The present invention relates generally to Micro-electro-mechanical systems (MEMS) and, in particular, to low power/low voltage integrated MEMS actuators.

BACKGROUND

MEM systems require actuating elements with multiple degrees of freedom, low power/low voltage actuation, fast operation, and compatibility with wafer level fabrication for integration into larger MEM systems and sub-systems. Most presently available actuators are deficient in one or more of these requirements. Micro-lens systems are one example of MEM systems that suffer from the above limitations.

SUMMARY

It is an object of the present invention to substantially overcome, or at least ameliorate, one or more disadvantages of existing arrangements.

Disclosed are arrangements, referred to as Corrugated Piezo-electrically Driven Actuator systems (also referred to as CPDA systems) which seek to address the above problems by using a series of appropriately configured piezo-electric transducer elements (also referred to as PZET elements) to drive a corrugated beam to assume one of a number of different geometric configurations depending upon which of a corresponding set of electric actuation signals are applied to the PZET elements. The beam lies in what is referred to as a "resting" plane while not being actuated, and can be driven according to one of four modes of movement. The four modes of movement include lateral movement (eg expansion and contraction) in the resting plane of the beam, and out-of-plane movement (ie up and down) in a direction perpendicular to the resting plane.

The disclosed CPDA systems provide four independent modes of movement depending on the biasing voltages and have low operating power consumption and low stand-by power requirements. When applied to systems such as micro-lens devices, CPDA systems enable significant miniaturisation.

According to a first aspect of the present invention, there is provided a piezo-electrically actuated micro-mechanical deformable member comprising:

a corrugated longitudinal beam formed in a substrate, said beam having a first anchored end and a second end;

a plurality of piezoelectric film (PZET) actuating segments formed in or on at least some grooves and ridges of the corrugated beam, the beam being configured to assume one of a number of different geometric configurations depending upon which of a corresponding set of electric actuation signals are applied to the PZET elements, said electric actuation signals establishing corresponding electric fields in the associated PZET segments to thereby deform the member;

the beam, having said plurality of piezoelectric film (PZET) actuating segments, being configured to extend in length in response to a first set of said electric actuation signals;

the beam, having said plurality of piezoelectric film (PZET) actuating segments, being configured to reduce in length in response to a second set of said electric actuation signals;

the beam, having said plurality of piezoelectric film (PZET) actuating segments, being configured to deflect the second end of the beam in a first direction in response to a third set of said electric actuation signals; and the beam, having said plurality of piezoelectric film (PZET) actuating segments, being configured to deflect the second end of the beam in a second direction in response to a fourth set of said electric actuation signals.

According to another aspect of the present invention, there is provided a piezo-electrically actuated micro-lens system comprising:

a flexible micro-lens;

a lens holding frame gripping the lens;

an inner rigid frame; and a plurality of piezo-electrically actuated micro-mechanical deformable members according to the first aspect of the invention, each said member being anchored to the inner rigid frame at the anchored end and the lens holding frame at another end, wherein:

the first and second set of said electric actuation signals respectively compress and expand the micro-lens, thereby respectively decreasing and increasing the focal length of the lens.

According to another aspect of the present invention, there is provided a piezo-electrically actuated micro-lens system comprising:

a flexible micro-lens;

a lens holding frame gripping the lens;

an inner rigid frame; and a plurality of piezo-electrically actuated micro-mechanical deformable members according to the first aspect of the invention, each said member being anchored to the inner rigid frame at the anchored end and the lens holding frame at another end, wherein:

the third and fourth set of said electric actuation signals respectively zoom the micro-lens in one direction and the other direction.

According to another aspect of the present invention, there is provided a method of deforming a piezo-electrically actuated micro-mechanical deformable member said method comprising the steps of:

providing a corrugated longitudinal beam formed in a substrate, said beam having a first anchored end and a second end;

providing a plurality of piezoelectric film (PZET) actuating segments formed in or on at least some grooves and ridges of the corrugated beam, the beam being configured to assume one of a number of different geometric configurations depending upon which of a corresponding set of electric actuation signals are applied to the PZET elements, said electric actuation signals establishing corresponding electric fields in the associated PZET segments to thereby deform the member; and performing at least one of the steps of:

applying a first set of said electric actuation signals to said plurality of piezoelectric film (PZET) actuating segments, to thereby extend the member in length;

applying a second set of said electric actuation signals to said plurality of piezoelectric film (PZET) actuating segments, to thereby reduce the member in length;

applying a third set of said electric actuation signals to said plurality of piezoelectric film (PZET) actuating segments, to thereby deflect the second end of the beam in a first direction; and applying a fourth set of said electric actuation signals to said plurality of piezoelectric film (PZET) actuating segments, to thereby deflect the second end of the beam in a second direction;

Other aspects of the invention are also disclosed.

BRIEF DESCRIPTION OF THE DRAWINGS

At least one embodiment of the present invention will now be described with reference to the drawings and appendices, in which:

FIGS. 4A and 4B show sectional views of the system of FIG. 3, showing the CPDA members in detail;

FIGS. 6A and 6B depict one mode of movement of the CPDA member of FIG. 5;

FIGS. 7A-7D depicts four modes of movement of the CPDA member of FIG. 5;

FIGS. 11A and 11B show another arrangement of the micro-lens system of FIG. 3, incorporating the segmented lens holding frame of FIG. 10A.

DETAILED DESCRIPTION INCLUDING BEST MODE

Figure 1:
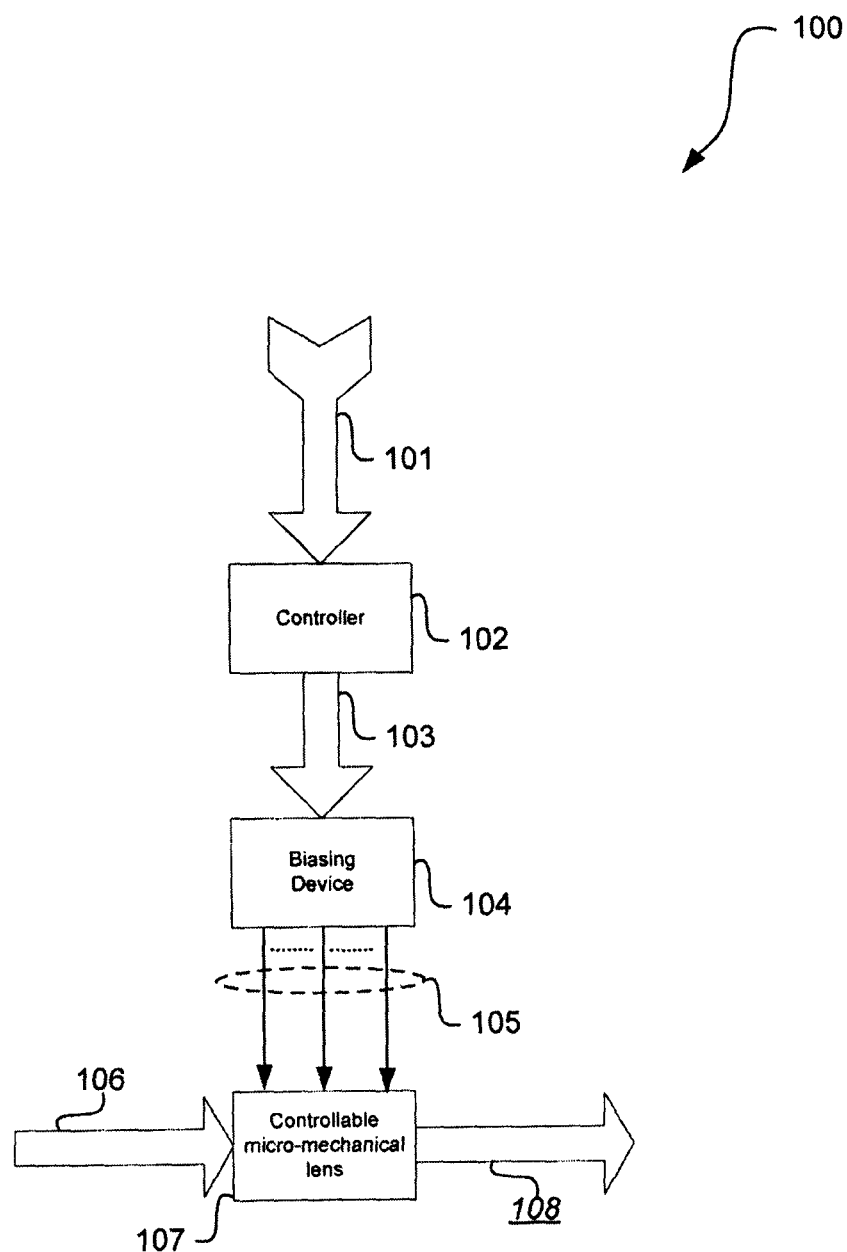
FIG. 1 is a functional block diagram of a micro-lens system using the CPDA arrangement.

Where reference is made in any one or more of the accompanying drawings to steps and/or features, which have the same reference numerals, those steps and/or features have for the purposes of this description the same function(s) or operation(s), unless the contrary intention appears.

It is to be noted that the discussions contained in the "Background" section and the section above relating to prior art arrangements relate to discussions of devices which may form public knowledge through their use. Such discussions should not be interpreted as representations by the present inventor(s), or by the patent applicant, that such devices in any way form part of the common general knowledge in the art.

Figure 5:
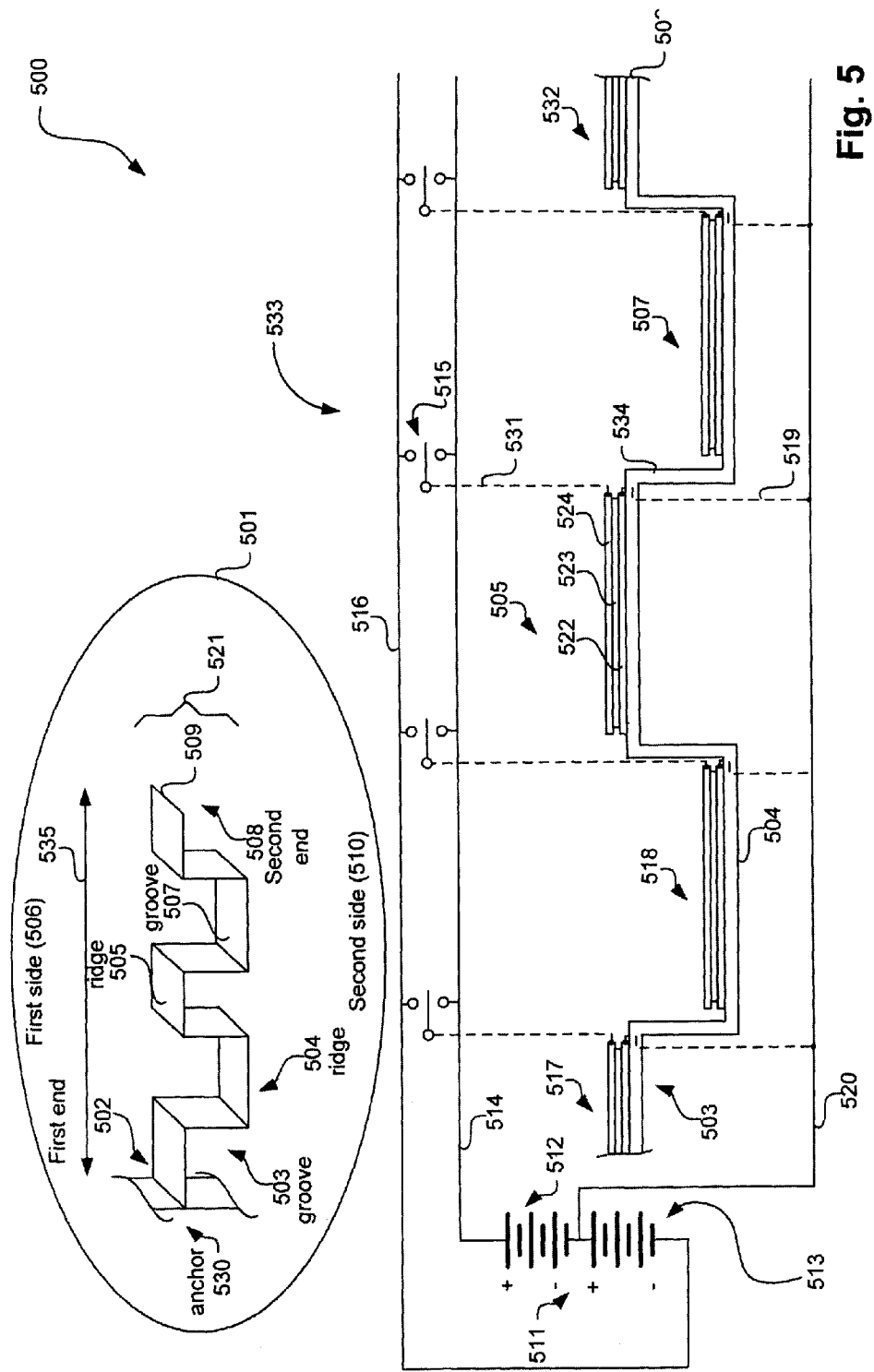
FIG. 5 shows the CPDA member in more detail.

FIG. 5 illustrates one example 500 of a CPDA member 521. The CPDA member 521 is shown from a perspective view in an inset 501 and from a side view at 533. The inset 501 shows that the CPDA member 521 is a corrugated beam in which the corrugations take the form, in the present example, of rectangular steps formed in a substrate which may be of semiconductor material, or some other suitable material. The stepped beam 509 is anchored at a first end 502 to an anchor member 530, and has a second end 508 free, thus disposing the beam 509 in a cantilever arrangement. From a first side 506 the beam 509 has a series of ridges such as 505 and a series of grooves such as 507. In the CPDA example shown in FIG. 5, the ridge 505 and the groove 507 are connected by a vertical riser 534, thus forming a rectangular step configuration. The riser 534 need not be vertical however, and thus the step configuration need not be rectangular. Moreover, the corrugations need not be made up of linear segments and the corrugations may make more smooth undulations as well. From a second side 510 the beam 509 has a series of ridges such as 504 and a series of grooves such as 503. In resting mode (ie when no actuation forces or biasing are applied) the CPDA member 521 lies in a resting plane (not shown), and has a resting length 535.

The side view 533 shows, deposited on the ridge 505, a metalized piezoelectric film segment comprising an un-metalized piezoelectric film segment 523 sandwiched between two conducting pads 524 and 522. In this specification, piezoelectric films are to also referred to as piezo-electric transducers (ie PZETs). Each conducting pad in the present example is continuous and substantially covers the un-metalized PZET segment 523. Similar metalized PZET segments are deposited on each of the ridges 517 and 532, and the grooves 518 and 507 on the first side 506 of the beam 509.

A voltage source 511 is provided to bias the PZET segments, and the voltage source 511 is split into two equal halves 512 and 513. A connection 520 is thus at "ground" potential, with a connection 514 having a positive potential with respect to ground, and a connection 516 having a negative potential with respect to ground.

Returning to the metalized PZET segment on the ridge 505, the lower conducting pad 522 is connected to the centre of the voltage source 511 as depicted by a connection 519. The upper conducting pad 524 is connected to a switch 515 as depicted by a connection 531. The switch 515 can connect the upper conducting pad 524 either to a negative side of the voltage source 513 as depicted by the connection 516, or to a positive side of the voltage source 512 as depicted by the connection 514. Accordingly, if the centre of the split voltage source 511 is regarded as a "ground" point, then the upper conducting pad 524 can, by means of the switch 515, either be biased at a positive voltage relative to the lower conducting pad, or at a negative voltage relative to the lower conducting pad. These positive or negative biasing conditions (also referred to as biasing which is 180° out of phase) establish corresponding oppositely directed electric fields in the PZET segment 523. These electric fields establish forces in the PZET segment 523 which are transferred to the ridge 505 of the beam 509, as described further in relation to FIGS. 6A and 6B.

Although FIG. 5 shows a particular biasing arrangement using conducting pads of the type shown, other biasing and conducting pad arrangements can be used. Thus for example inter-digitated conducting pad arrangements may be used in order to bias the PZET segments 523. Furthermore, although in the described example the metalized piezoelectric film segments are all deposited on ridges and grooves on one side of the CPDA member 521, the metalized PZET segments may be deposited on both sides of the CPDA member 521 provided that the appropriate biasing arrangements are used.

Furthermore, although FIG. 5 shows that all CPDA members are biased with one of two voltages that are available on busses 514, 516, a biasing device 104 (see FIG. 1) can be implemented in such as way as to provide an individually customised voltage to each CPDA member without reference to voltages provided to other CPDA members. This for example enables fabrication variances to be compensated for.

FIGS. 6A and 6B illustrate one example and mode of movement of the CPDA member 521 of FIG. 5. A partial illustration of one example of the CPDA member 521 is shown at FIG. 6A, in which the beam 509 is made of Silicon with thickness $t_{si}$ (ie 605, 606) of 2 µm, and the PZET 604 is made of Lead zirconate titanate and is 1 µm thick (referred to as being of thickness $t_p$). PZETs made of Lead zirconate titanate are also referred to as PZTs. The ridges and grooves (which are also referred to simply as steps unless otherwise indicated) are of equal 100 µm lengths b (ie 602). The height h (ie 601) of each step can range between 2 µm-8 µm. The aforementioned dimensions are merely examples of the design parameters (ie lengths of the grooves and ridges and step height) and may be varied as desired. The CPDA structure in FIG. 6A has a resting length 603, this being the length of the CPDA member 521 when no biasing is applied to the PZET elements such as 604.

In FIG. 6B the PZET films (eg 605) at the consecutive steps are driven by 180° out-of-phase electrical voltages (referred to as +V and −V). This biasing causes the PZET elements to flex as shown, establishing corresponding forces in the Silicon beam. Thus for example flexing of the PZET biased by +V at 607 causes corresponding flexing of the silicon ridge upon which the PZET is deposited. Similar flexing occurs in a PZET 612 and the associated Silicon groove 611. This flexing generates in-plane movement, depicted as Δx (ie 609) for each step, causing the overall. CPDA member to extend in length. Accordingly, a length 613 of the biased (ie actuated) CPDA member is longer than the resting length 603 of the un-biased (ie un-actuated) CPDA member.

FIGS. 7A-7D depicts four modes of movement of the CPDA member of FIG. 5. Depending upon the particular biasing applied, four different modes of movement can be generated. These modes of movement are as follows:
 (a) Mode 1: extension in the length of the CPDA member relative to the associated resting length, the extended CPDA member lying substantially in the resting plane;
 (b) Mode 2: reduction in the length of the CPDA member relative to the associated resting length, the shortened CPDA member lying substantially in the resting plane;
 (c) Mode 3: deflection of the CPDA member to one side of the resting plane; and
 (d) Mode 4: deflection of the CPDA member to the other side of the resting plane.

FIG. 7A shows how the PZET members at the grooves such as 702 and the ridges such as 703 are biased with voltages of −V and +V respectively, relative to the ground point 520 as depicted in FIG. 5. This biasing arrangement results in extension in the length of the CPDA member relative to the associated resting length, the extended CPDA member of length 705 lying substantially in the resting plane.

FIG. 7B shows how the PZET members at the grooves such as 707 and the ridges such as 708 are biased with voltages of +V and −V respectively, relative to the ground point 520 as depicted in FIG. 5. This biasing arrangement results in reduction in the length of the CPDA member relative to the associated resting length, the shortened CPDA member of length 710 lying substantially in the resting plane.

FIG. 7C shows how the PZET members at the grooves such as 712 and the ridges such as 711 are all biased with voltages of +V relative to the ground point 520 as depicted in FIG. 5. This biasing arrangement results in deflection of the CPDA member to one side of the resting plane as depicted by a positive displacement +Δz as depicted by 714.

FIG. 7D shows how the PZET members at the grooves such as 716 and the ridges such as 715 are all biased with voltages of −V relative to the ground point 520 as depicted in FIG. 5. This biasing arrangement results in deflection of the CPDA member to the other side of the resting plane as depicted by a negative displacement −Δz as depicted by 718.

FIG. 1 is a functional block diagram of a micro-lens system using the CPDA arrangement. Light is input 106 to a micro-mechanical lens 107 which processes the incoming light to produce outgoing light 108. The lens 107 is controlled according to an input signal 101, which can change the focal length of the lens 107 and/or controls the zoom position of the lens. In order to do so, the control signal 101 is directed to a controller 102, which can be implemented using a standard micro-controller or Personal Computer (PC). The controller 102 consequently generates a control signal 103 for a biasing device which outputs a number of control signals (also referred to as set of electric actuation signals) 105. These control signals 105 are used to bias PZET elements associated with CPDA members in the lens 107. This biasing enables the control signal to change the focal length of the lens 106 and/or control the zoom position of the lens 107 as will be described in more detail in regard to FIGS. 3-8.

Figure 2:
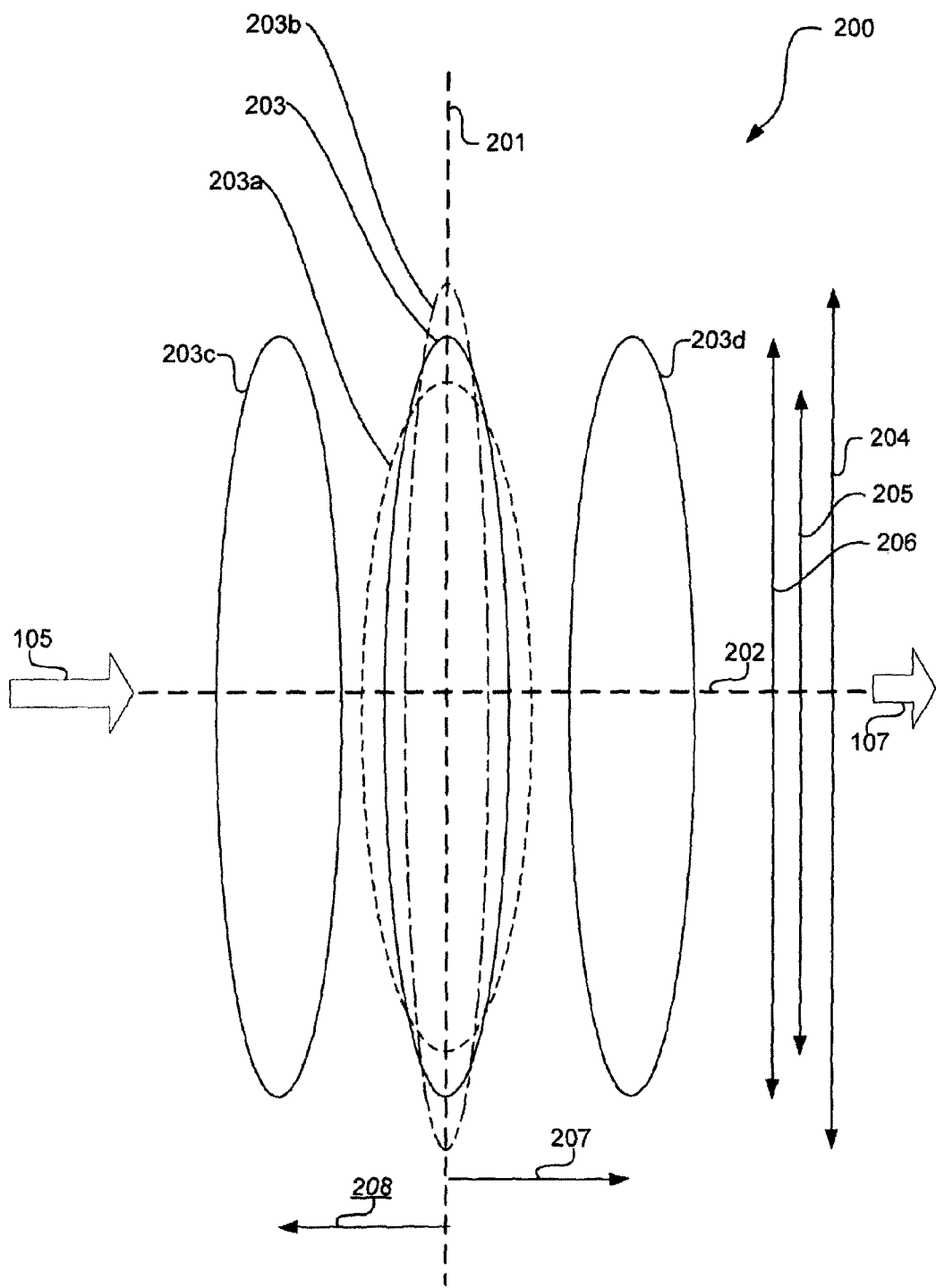
FIG. 2 depicts how the micro-lens in the system of FIG. 1 is controlled.

FIG. 2 depicts how the micro-lens in the system of FIG. 1 is controlled. FIG. 2 shows a flexible lens 203 of diameter 206 whose shape can be changed using the CPDA approach, as will be described in more detail in regard to FIGS. 3-8. The lens 203 can be compressed to a diameter 205 (as depicted by 203a) thereby decreasing the focal length of the lens. Alternately, the lens 203 can be expanded to a diameter 204 (as depicted by 203b) thereby increasing the focal length of the lens.

In addition or alternately, the position of the lens 203 can be moved forward as depicted by an arrow 207, or can be moved backwards as depicted by an arrow 208, to thereby zoom the lens in one direction or the other direction.

Figure 3:
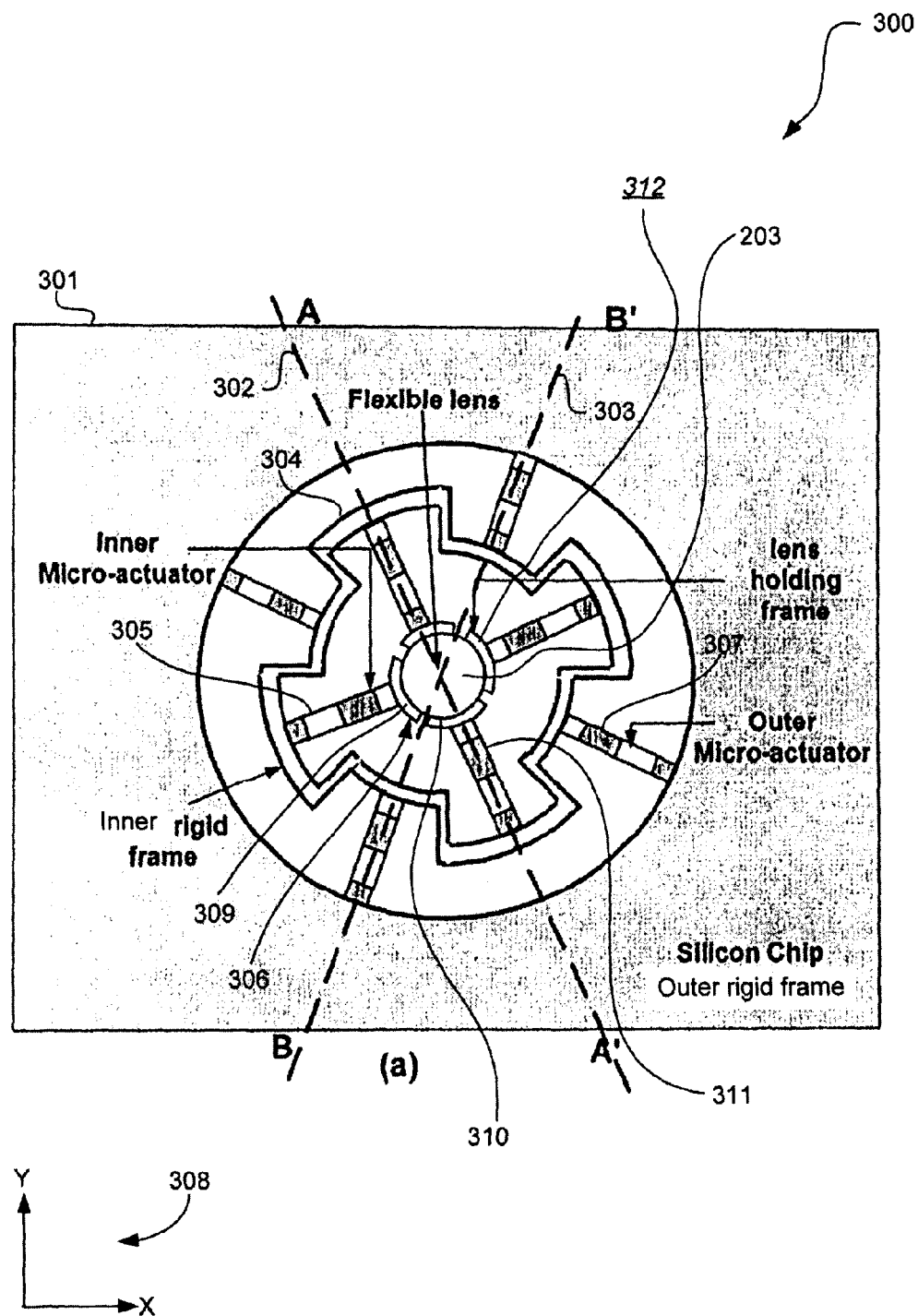
FIG. 3 illustrates how the micro-lens system of FIGS. 1 and 2 can be fabricated in integrated chip form.

FIG. 3 illustrates how a micro-lens system 300 according to FIGS. 1 and 2 can be fabricated in integrated chip form.

The micro-mechanical lens consists of two sets of CPDA members. Each of a first (outer) set of CPDA members (eg 307) is attached to a chip 301 (acting as an outer rigid frame) at one end and to an inner rigid frame 304 at the other end. These CPDA members are biased in order to effect movement Modes 3 and 4 in order to achieve out-of-plane movement of the lens 203, to thus adjust the zoom position of the lens 203. In zooming the lens, the optical axis of the lens is maintained in substantially the same direction as that of the optical axis when the lens is at rest (ie when the CPDA members are not biased). Each of a second (inner) set of CPDA members (eg 305) is connected at one end to the micro-lens 203 via a segmented lens holding frame 306, and is connected and to the inner rigid frame 304 at the other end. These CPDA members are biased in order to effect movement Modes 1 and 2 in order to compress and expand the lens 203 laterally, in order to adjust the focal length of the lens 203.

Figure 8A:
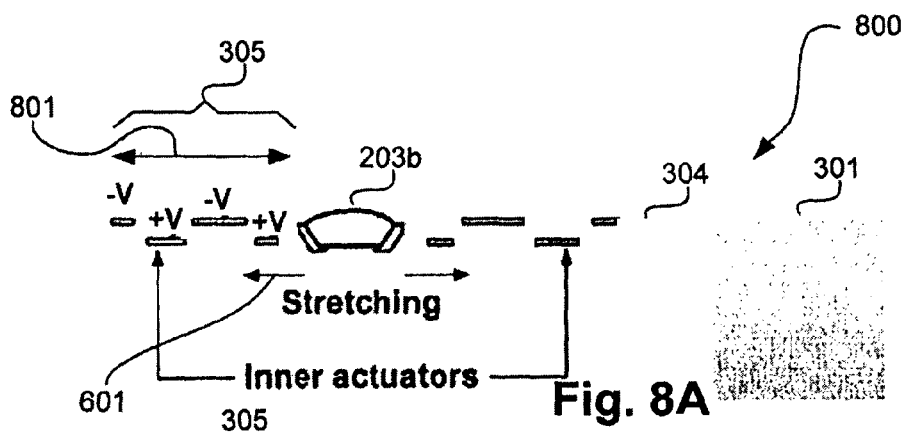
FIGS. 8A-8D shows the arrangement in FIGS. 4A and 4B when actuated according to the four available modes of movement.
Figure 8B:
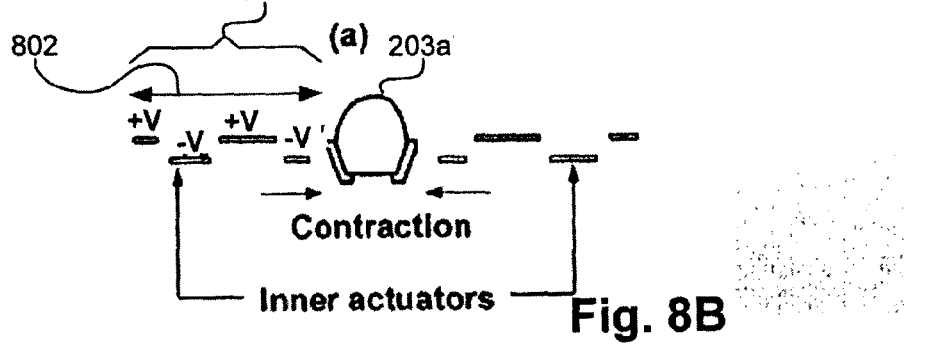
Figure 8C:
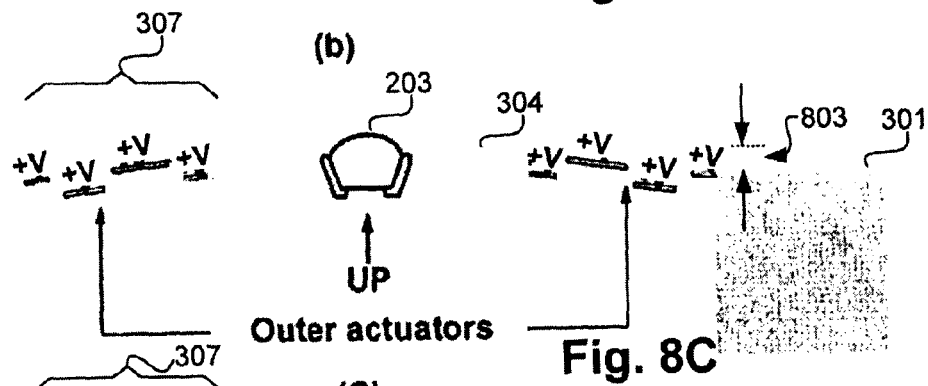
Figure 8D:
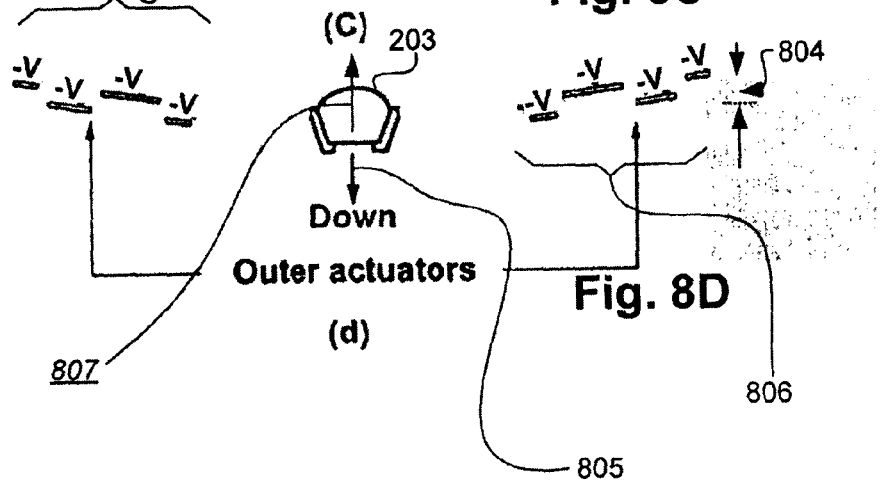

Considering the segmented lens holding frame in more detail, it is noted that the frame referred to as 306 is made up, in the present example, of four distinct independently movable segments such as 309. When the individual segments such as the segments 309 and 312 are urged towards each other by their respective CPDA members as depicted, for instance, in FIG. 7A, then the lens 203 is compressed as depicted in FIG. 8B. Alternately, when the individual segments such as the segments 309 and 312 are urged away each other by their respective PZETs as depicted, for instance, in FIG. 7B, the lens 203 is stretched as depicted in FIG. 8A. Thus, although the lens holding frame is made up of rigid segments, by moving the segments appropriately, the forces generated by the inner and outer CPDA members can be transferred to the flexible lens 203.

Although the example shown in FIG. 3 uses a segmented lens holding frame, other lens holding frame arrangements can also be used to couple the forces generated by the inner and outer CPDA members to the flexible lens 203.

An inset 308 defines a set of X-Y axes which describe a resting plane associated with the inner rigid frame 304, in which lateral movement of the CPDA members is effected using Mode 1 and Mode 2.

Standard fabrication techniques can be used to implement the micro-lens system of FIG. 3. Accordingly, the outer and inner CPDA members as well as the inner rigid frame and the lens holding frame can be fabricated using standard integrated circuit fabrication techniques, while the flexible lens 203 can be mounted using micro-manipulators.

An alternate approach is to form and integrate the polymer encapsulated polymer lens 203 with the lens actuating mechanism. MEMS processes are generally planar in nature, while lenses such as 203 are non-planar structures. However this difficulty can be overcome by forming planar structure using standard planar MEMS processes and transforming the planar structure so formed into a non-planar lens structure using heat treatment.

This involves the use of a polymer, which decomposes into gaseous products when heated. PNB (PolyNorBornene) polymer is one such polymer, which can be used in this manner. Firstly a recess, defined by the lens holding frame 306, is covered by a bottom polymer referred to as "polymer 1". The PNB is then deposited to fill the recess. After patterning the PNB, a top polymer referred to as "polymer 2", is deposited to cover the PNB. When the sandwich structure in the recess is heated, the PNB decomposes to gaseous products, which builds up pressure and bulges out polymer 2 thus forming the convex lens 203.

Various polymide materials can be used to form the encapsulating layers polymer 1 and polymer 2.

After the polymer encapsulated air convex lens formation step, in order to increase the refractive power of the lens if so desired, the air gap can be filled by UV (Ultra-Violet)-curable polymer using micro-injection methods. Exposing the sample to UV creates the convex elastic polymer lens 203.

Although FIG. 3 shows an arrangement providing for both focal length adjustment and zoom adjustment, it is also possible to provide for only one or only the other capability.

FIGS. 4A and 4B show sectional views of the system of FIG. 3, showing the CPDA members in more detail. An inset 403 defines a set of X-Y-Z. The X-Y axes describe the resting plane associated with the inner rigid frame 304, in which lateral movement of the inner CPDA members is effected according to movement Mode 1 and Mode 2. The Z axis describes the direction in which out-of-plane movement of, the outer CPDA members is effected according to movement Mode 3 and Mode 4.

The cross section views show the inner CPDA members such as 305 and the outer CPDA members such as 307. The micro-lens 203 is made of elastic material so that its shape changes when it is compressed or stretched by the inner CPDA members. Polymers, such as Polydimethylsiloxane (also known as PDMS) or SU-8 (a commonly used epoxy-based negative photoresist) can be used to fabricate the elastic micro-lens 203.

The CPDA arrangement provides four modes of movement depending on the biasing voltages. These modes are lateral movements in the X-Y plane (ie Modes 1 and 2) and out-of-plane movements (ie Modes 3 and 4) which refer to movement up and down in the Z direction.

The four modes of movement produce four independent operations for the lens system 107. The PZET members on consecutive steps of the CPDA members are biased independently. Furthermore, although the magnitude of +V (eg see 607 in FIG. 6B) can be made to be equal to the magnitude of −V (eg see 607 in FIG. 6B) if desired, the magnitudes of these biasing voltages need not be the same if, for example, it is desired to use differing magnitudes for the biasing voltages in order to compensate for fabrication variances in the CPDA members.

FIGS. 8A-8D shows the arrangement in FIGS. 4A and 4B when actuated according to the four available modes of movement. Each figure illustrates a particular mode of movement.

When the voltages are of opposing signs, modes of lens expansion (FIG. 8A) and lens contraction (FIG. 8B) are achieved. In the case of the same voltage signs, up (FIG. 8C) or down (FIG. 8D) modes are obtained.

The modes of contraction and expansion perform focal length tuning of the micro-lens 203. When the elastic micro-lens is stretched, it elongates and increases the focal length of the lens. Compression of the lens, on the other hand, bows the lens out and decreases focal length.

Out-of-plane up and down modes play a crucial role in achieving zooming capability. In the present example the outer set 307 of CPDA members is operated in up and down modes, while the inner set 305 of the CPDA members are biased for contraction and expansion modes.

Figure 9:
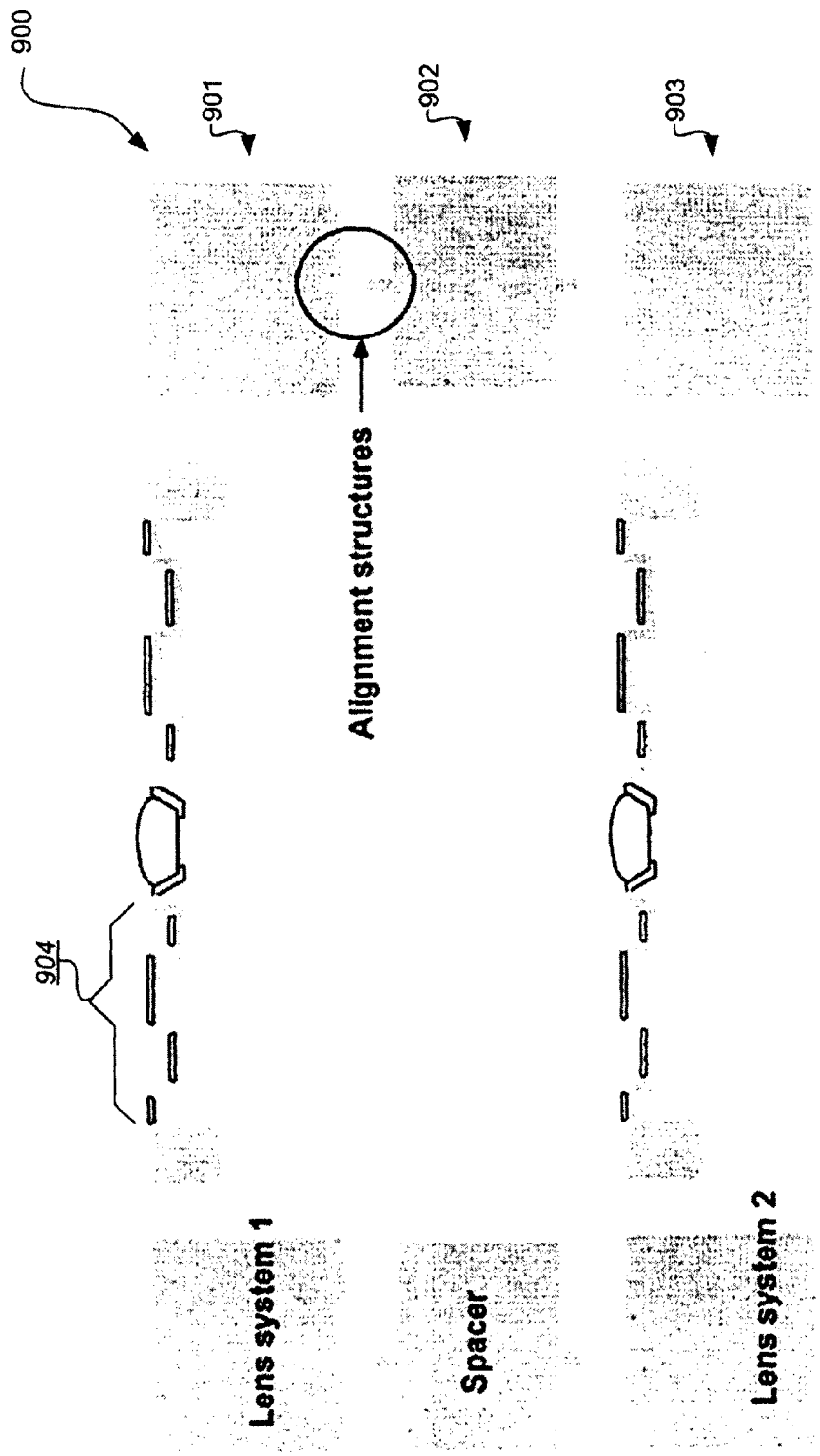
FIG. 9 depicts a compound arrangement of lenses such as the lens shown in FIGS. 4A and 4B.

FIG. 9 depicts a compound arrangement of lenses such as the lens shown in FIGS. 4A and 4B. In this arrangement, two similar micro-lens systems are employed for effective and wide range zooming capability. Each of the micro-lens systems has its own CPDA mechanism (eg 904) for tuning its focal length as illustrated in FIG. 4A. Each of the micro-lens systems also has its own CPDA mechanism for tuning its zoom position (not shown) as illustrated in FIG. 4B.

The lens systems are stacked vertically with a spacer 902 in between. The spacer 902 defines the vertical spacing between the lens systems 901, 903, which will be a design parameter for two-lens system.

Figure 10B:
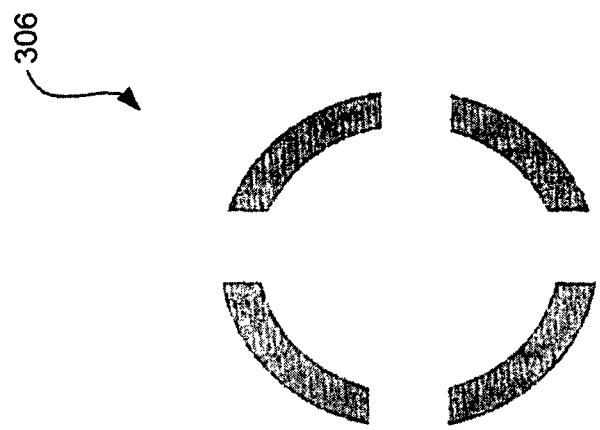
FIGS. 10B and 10A respectively depict the segmented lens holding frame shown in FIG. 3, and another arrangement thereof.
Figure 10A:
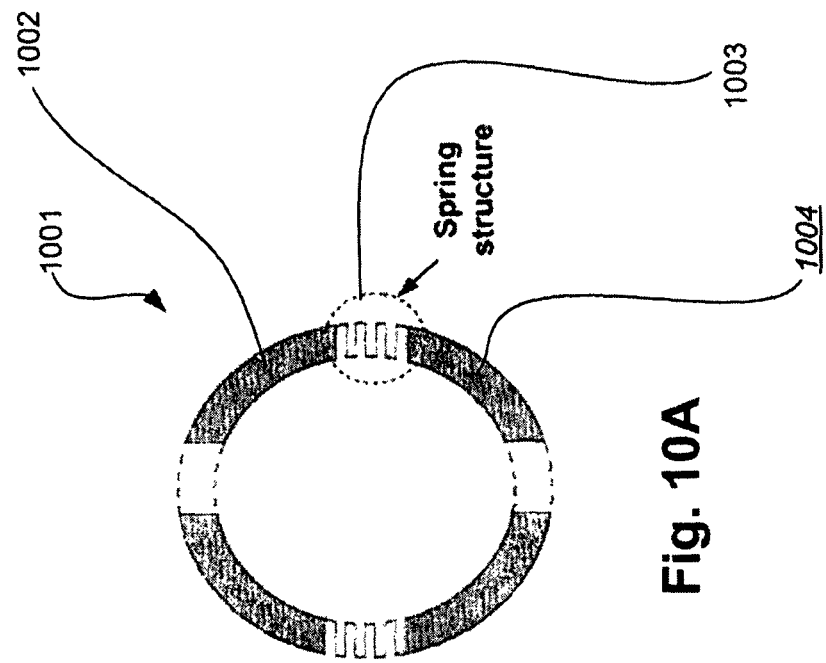

FIGS. 10B and 10A respectively depict the segmented lens holding frame 306 shown in FIG. 3, and another arrangement 1001 thereof. In FIG. 3 the lens holding frame 306 has four segments such as 309, 310 with no attachment to each other. The segments 309, 310 are supported by respective inner CPDA members 305, 311. These segments 309, 310 etc. can be modified as depicted in FIG. 10A in order to improve uniformity of force (pressure) on the polymer lens 203. In FIG. 10A each segment 1002 is connected to an adjacent segment 1004 by a pliable spring structure 1003. This arrangement improves the uniformity of force applied by the various inner CPDA members on the lens. The spring structure 1003 is fabricated in the same manner as the other components in the micro-lens system 300.

FIGS. 11A and 11B show another arrangement of the micro-lens system of FIG. 3, incorporating the segmented lens holding frame 1002 of FIG. 10A. In FIG. 3 the outer CPDA members 307 are straight (ie linear). These CPDA members can also be configured in a folded shape as shown at 1101 in FIG. 11A. By doing so, the length 1102 of the CPDA member 1101 is enlarged, while shortening its radial length 1103. This enables implementation of CPDA members which consume less area in the micro lens system, while maintaining or improving the out-of-plane deflection range. This in turn makes room for a larger diameter lens 1104. Accordingly, this rearrangement of the direction of the outer CPDA members 1101 provides extended actuation out-of-plane range, and allows for better lens fill-factor.

In FIGS. 8A-8D, the magnitude of the driving voltages for all outer CPDA members such as 307 are assumed to be the same. This enables out-of-plane deflection in the "Z" direction 805 to be achieved without tilting of the lens 203.

By setting the driving voltage for each of the outer CPDA members at different magnitudes (in other words by driving each of the outer CPDA members eg 307 and 806 independently), the outer CPDA members 307, 807 can tilt the lens 203 so that the associated optical axis 807 is not vertical (ie at 90 deg) to the X-Y plane.

Figure 12:
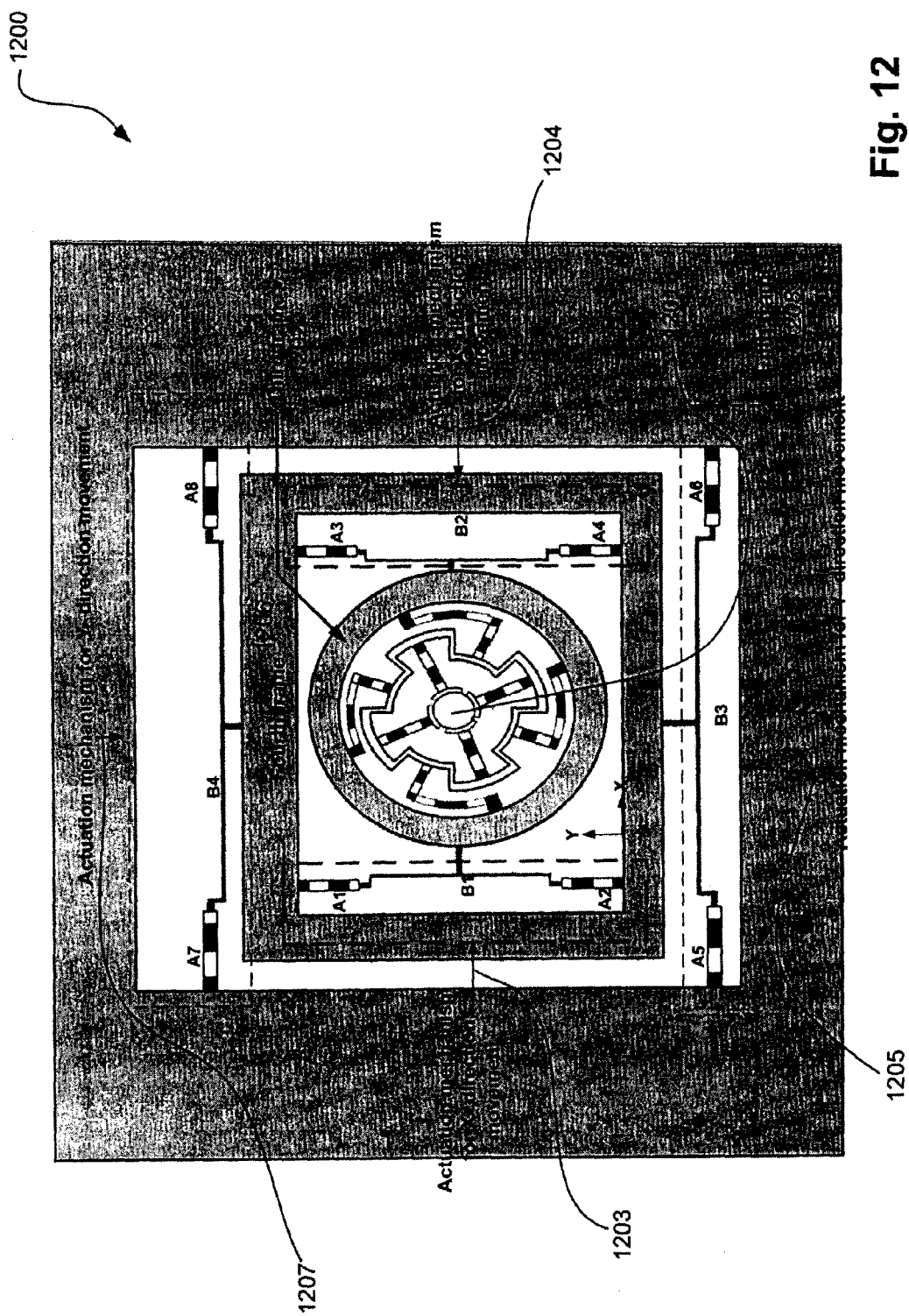
FIG. 12 shows another arrangement of the micro-lens system 300 capable of movement in the X-Y direction as well as along the optical [Z] axis of the lens.

FIG. 12 shows another arrangement 1200 of a micro-lens system where a lens 1201 is capable of movement in the X-Y direction as well as along the optical [Z] axis of the lens. The X-Y plane is also referred to as a lateral plane perpendicular to the optical axis of the lens. FIG. 12 illustrates one of the ways in which the actuation mechanism depicted in FIG. 3 can be modified to provide lens movements in X-Y direction.

Two sets of CPDA members, one for X-movement (A1, A2,A3,A4) and another for Y-movement (A5,A6,A7,A8) are added to the arrangement of FIG. 11A. The CPDA members A1, A2, A3 and A4 are attached to a fourth frame 1206 at one end, and to respective beams B1 and B2 at the other end. The CPDA members A5, A6, A7 and A8 are attached to a fifth frame 1208 at one end, and to respective beams B3 and B4 at the other end. When the CPDA members A1, A2 are biased so that they extend in the lateral direction along their lengths, they bow the slightly folded beam, B1, in the X-direction, which in turn moves a third frame 1202 (which is equivalent to the outer frame 301 in FIG. 3) and produces movement of the lens in the positive X-direction 1203. The CPDA members A3, A4 can be biased in a similar manner to produce lens movement in the negative X-direction 1204. When the CPDA members A5, A6 are biased so that they extend in the lateral direction along their lengths, they bow the slightly folded beam, B3, in the Y-direction 1205, which in turn moves a fourth frame 1206 and produces movement of the lens in positive Y-direction. The CPDA members A7, A8 are used to produce lens movement in the negative Y-direction 1207.

INDUSTRIAL APPLICABILITY

The arrangements described are applicable to the optical and processing industries such as cameras for cell phones and other portable devices, security, intelligence and surveillance systems, capsule endoscopes for micro-surgery, compound eyes for missile's tracking system, sensors in automobile for recognizing traffic lane and miniaturized speed cameras, pico-projectors and other devices and sub-systems.

The foregoing describes only some embodiments of the present invention, and modifications and/or changes can be made thereto without departing from the scope and spirit of the invention, the embodiments being illustrative and not restrictive.

The invention claimed is:

1. A piezo-electrically actuated micro-mechanical deformable member comprising:
    a corrugated longitudinal beam formed in a substrate, said beam having a first anchored end and a second end;
    a plurality of piezoelectric film (PZET) actuating segments formed in or on at least some grooves and ridges of the corrugated beam,
    the beam being configured to assume one of a number of different geometric configurations depending upon which of a corresponding set of electric actuation signals are applied to the PZET actuating segments, said electric actuation signals establishing corresponding electric fields in the associated PZET actuating segments to thereby deform the member;
    the beam, having said plurality of piezoelectric film (PZET) actuating segments, being configured to extend in length in response to a first set of said electric actuation signals;
    the beam, having said plurality of piezoelectric film (PZET) actuating segments, being configured to reduce in length in response to a second set of said electric actuation signals;
    the beam, having said plurality of piezoelectric film (PZET) actuating segments, being configured to deflect the second end of the beam in a first direction in response to a third set of said electric actuation signals; and
    the beam, having said plurality of piezoelectric film (PZET) actuating segments, being configured to deflect the second end of the beam in a second direction in response to a fourth set of said electric actuation signals.

2. A piezo-electrically actuated micro-mechanical deformable member according to claim 1, wherein the corrugations of the beam are formed as rectangular steps.

3. A piezo-electrically actuated micro-mechanical deformable member according to claim 2 wherein:
    the steps are formed using Silicon of thickness 2 μm and PZET segments of thickness 1 μm; and
    the ridges and grooves of the steps are of length 100 μm; and
    the height of the steps range between 2 μm.

4. A piezo-electrically actuated micro-mechanical deformable member according to claim 1, wherein the corrugations of the beam are formed as steps in which a portion of the corrugation connecting the ridges and the grooves is not vertical.

5. A piezo-electrically actuated micro-mechanical deformable member according to claim 4, wherein at least some of the grooves and ridges on the same side of the beam have metallised PZET segments for receiving the electric actuation signals, each metallised PZET segment comprising a said PZET segment sandwiched between two conducting pads, each said conducting pad being continuous and substantially covering said PZET segment.

6. A piezo-electrically actuated micro-mechanical deformable member according to claim 1, wherein the first set of electric actuation signals comprise positive voltages applied to the PZET segments at the ridges of the beam and negative voltages applied to the PZET segments at the grooves of the beam.

7. A piezo-electrically actuated micro-mechanical deformable member according to claim 4, wherein at least some of the grooves and ridges on the same side of the beam have metallised PZET segments for receiving the electric actuation signals, each metallised PZET segment having an inter-digitated configuration.

8. A piezo-electrically actuated micro-mechanical deformable member according to claim 1, wherein the second set of electric actuation signals comprise negative voltages applied to the PZET segments at the ridges of the beam and positive voltages applied to the PZET segments at the grooves of the beam.

9. A piezo-electrically actuated micro-mechanical deformable member according to claim 1, wherein the third set of electric actuation signals comprise positive voltages applied to the PZET segments at the ridges of the beam and positive voltages applied to the PZET segments at the grooves of the beam.

10. A piezo-electrically actuated micro-mechanical deformable member according to claim 1, wherein the fourth set of electric actuation signals comprise negative voltages applied to the PZET segments at the ridges of the beam and negative voltages applied to the PZET segments at the grooves of the beam.

11. A piezo-electrically actuated micro-lens system comprising:
   a flexible micro-lens;
   a lens holding frame gripping the lens;
   an inner rigid frame; and
   a first plurality of piezo-electrically actuated micro-mechanical deformable members, each said member comprising:
      a corrugated longitudinal beam formed in a substrate, said beam having a first anchored end and a second end;
      a plurality of piezoelectric film (PZET) actuating segments formed in or on at least some grooves and ridges of the corrugated beam,
      the beam being configured to assume one of a number of different geometric configurations depending upon which of a corresponding set of electric actuation signals are applied to the PZET actuating segments, said electric actuation signals establishing corresponding electric fields in the associated PZET actuating segments to thereby deform the member;
      the beam, having said plurality of piezoelectric film (PZET) actuating segments, being configured to extend in length in response to a first set of said electric actuation signals;
      the beam, having said plurality of piezoelectric film (PZET) actuating segments, being configured to reduce in length in response to a second set of said electric actuation signals;
      the beam, having said plurality of piezoelectric film (PZET) actuating segments, being configured to deflect the second end of the beam in a first direction in response to a third set of said electric actuation signals; and
      the beam, having said plurality of piezoelectric film (PZET) actuating segments, being configured to deflect the second end of the beam in a second direction in response to a fourth set of said electric actuation signals;
   each of the first plurality of piezo-electrically actuated micro-mechanical deformable members are anchored to the inner rigid frame at the anchored end and the lens holding frame at another end, and wherein the first and second set of said electric actuation signals respectively compress and expand the micro-lens, thereby respectively decreasing and increasing the focal length of the lens.

12. A piezo-electrically actuated micro-lens system according to claim 11 further comprising:
   an outer rigid frame; and
   a second plurality of the piezo-electrically actuated micro-mechanical deformable members, each of the second plurality of members being anchored to the outer rigid frame at the anchored end and the inner rigid frame at another end, wherein:
   the third and fourth set of said electric actuation signals respectively zoom the micro-lens in one direction and the other direction.

13. A piezo-electrically actuated micro-lens system according to claim 12 further comprising:
   a fourth rigid frame disposed outside the outer rigid frame; and
   a third plurality of the piezo-electrically actuated micro-mechanical deformable members, each of the third plurality of said members being anchored to the fourth rigid frame at the anchored end and a deformable beam at another end, said deformable beam being attached to the outer rigid frame, wherein:
   the first and second set of said electric actuation signals respectively move the micro-lens in a first direction and a second direction substantially opposite to the first direction, in the lateral plane perpendicular to the optical axis of the lens.

14. A piezo-electrically actuated micro-lens system according to claim 13 further comprising:
   a fifth rigid frame disposed outside the fourth rigid frame; and
   a fourth plurality of the piezo-electrically actuated micro-mechanical deformable members, each of the fourth plurality of said members being anchored to the fifth rigid frame at the anchored end and a deformable beam at another end, said deformable beam being attached to the fourth rigid frame, wherein:
   the first and second set of said electric actuation signals respectively move the micro-lens in a third direction and a fourth direction substantially opposite to the third direction, said third and fourth directions being substantially perpendicular to the first and second directions, in the lateral plane perpendicular to the optical axis of the lens.

15. A piezo-electrically actuated micro-lens system according to claim 14 wherein one or more of the piezo-electrically actuated micro-mechanical deformable members is disposed in a folded configuration.

16. A piezo-electrically actuated micro-lens system according to claim 11 wherein the first and second set of said electric actuation signals have the same magnitudes to thereby maintain an optical axis of the lens substantially parallel to the optical axis when the electric actuation signals are not applied.

17. A piezo-electrically actuated micro-lens system according to claim 11 wherein the first and second set of said electric actuation signals have different magnitudes to thereby tilt an optical axis of the lens away from a direction of the optical axis when the electric actuation signals are not applied.

18. A piezo-electrically actuated micro-lens system comprising:
   a flexible micro-lens;
   a lens holding frame gripping the lens;
   an inner rigid frame; and
   a plurality of piezo-electrically actuated micro-mechanical deformable members, each said member comprising:
      a corrugated longitudinal beam formed in a substrate, said beam having a first anchored end and a second end;
      a plurality of piezoelectric film (PZET) actuating segments formed in or on at least some grooves and ridges of the corrugated beam,
      the beam being configured to assume one of a number of different geometric configurations depending upon which of a corresponding set of electric actuation signals are applied to the PZET actuating segments, said electric actuation signals establishing corresponding electric fields in the associated PZET actuating segments to thereby deform the member;

the beam, having said plurality of piezoelectric film (PZET) actuating segments, being configured to extend in length in response to a first set of said electric actuation signals;

the beam, having said plurality of piezoelectric film (PZET) actuating segments, being configured to reduce in length in response to a second set of said electric actuation signals;

the beam, having said plurality of piezoelectric film (PZET) actuating segments, being configured to deflect the second end of the beam in a first direction in response to a third set of said electric actuation signals; and the beam, having said plurality of piezoelectric film (PZET) actuating segments, being configured to deflect the second end of the beam in a second direction in response to a fourth set of said electric actuation signals; and anchored to the inner rigid frame at the anchored end and the lens holding frame at another end, and wherein the third and fourth set of said electric actuation signals respectively zoom the micro-lens in one direction and the other direction.

19. A method of deforming a piezo-electrically actuated micro-mechanical deformable member said method comprising the steps of:

providing a corrugated longitudinal beam formed in a substrate, said beam having a first anchored end and a second end;

providing a plurality of piezoelectric film (PZET) actuating segments formed in or on at least some grooves and ridges of the corrugated beam, the beam being configured to assume one of a number of different geometric configurations depending upon which of a corresponding set of electric actuation signals are applied to the PZET actuating segments, said electric actuation signals establishing corresponding electric fields in the associated PZET actuating segments to thereby deform the member; and performing at least one of the steps of:

applying a first set of said electric actuation signals to said plurality of piezoelectric film (PZET) actuating segments, to thereby extend the member in length;

applying a second set of said electric actuation signals to said plurality of piezoelectric film (PZET) actuating segments, to thereby reduce the member in length;

applying a third set of said electric actuation signals to said plurality of piezoelectric film (PZET) actuating segments, to thereby deflect the second end of the beam in a first direction; and applying a fourth set of said electric actuation signals to said plurality of piezoelectric film (PZET) actuating segments, to thereby deflect the second end of the beam in a second direction.

* * * * *